United States Patent
Watanabe et al.

(10) Patent No.: US 11,526,975 B2
(45) Date of Patent: Dec. 13, 2022

(54) METHOD FOR DISPLAYING INDEX VALUES IN GENERATION OF MASK PATTERN VERIFICATION MODEL

(71) Applicant: Kioxia Corporation, Tokyo (JP)

(72) Inventors: Yuki Watanabe, Yokohama Kanagawa (JP); Taiki Kimura, Kawasaki Kanagawa (JP); Kazufumi Shiozawa, Yokohama Kanagawa (JP); Kouichi Nakayama, Hiratsuka Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 654 days.

(21) Appl. No.: 16/559,713

(22) Filed: Sep. 4, 2019

(65) Prior Publication Data
US 2020/0118261 A1  Apr. 16, 2020

(30) Foreign Application Priority Data
Oct. 10, 2018  (JP) .............................. JP2018-192027

(51) Int. Cl.
| | | |
|---|---|---|
| G06T 7/00 | (2017.01) | |
| G03F 1/38 | (2012.01) | |
| G03F 7/20 | (2006.01) | |
| G03F 1/36 | (2012.01) | |
| G06F 30/398 | (2020.01) | |

(52) U.S. Cl.
CPC .............. *G06T 7/0004* (2013.01); *G03F 1/36* (2013.01); *G03F 1/38* (2013.01); *G03F 7/70441* (2013.01); *G06F 30/398* (2020.01)

(58) Field of Classification Search
CPC ....... G06T 7/0004; G06F 30/398; G03F 1/36; G03F 1/38
See application file for complete search history.

(56) References Cited

U.S. PATENT DOCUMENTS

| | | | |
|---|---|---|---|
| 8,381,138 B2 | 2/2013 | Matsunawa et al. | |
| 8,438,505 B2 | 5/2013 | Tsai et al. | |
| 2008/0077907 A1* | 3/2008 | Kulkarni | G03F 1/36 716/53 |
| 2010/0177952 A1 | 7/2010 | Mitsui | |
| 2012/0098953 A1* | 4/2012 | Kotaki | H01J 37/222 348/80 |
| 2014/0059502 A1 | 2/2014 | Miyoshi et al. | |
| 2019/0147134 A1* | 5/2019 | Wang | G06F 30/398 716/52 |

FOREIGN PATENT DOCUMENTS

| | | |
|---|---|---|
| JP | 5389456 B2 | 1/2009 |
| JP | 2010122438 A | 6/2010 |
| JP | 2013004672 A | 1/2013 |
| JP | 2014206550 A | 10/2014 |
| JP | 5917337 B2 | 5/2016 |

* cited by examiner

Primary Examiner — Myron Wyche
(74) Attorney, Agent, or Firm — Holtz, Holtz & Volek PC

(57) ABSTRACT

According to one embodiment, a method for displaying an index value in generation of a mask pattern verification model includes: calculating a first index value using a plurality of images; estimating a model on the basis of the first index value and pattern information; calculating a second index value using the model; and displaying at least one of the first index value and the second index value.

19 Claims, 13 Drawing Sheets

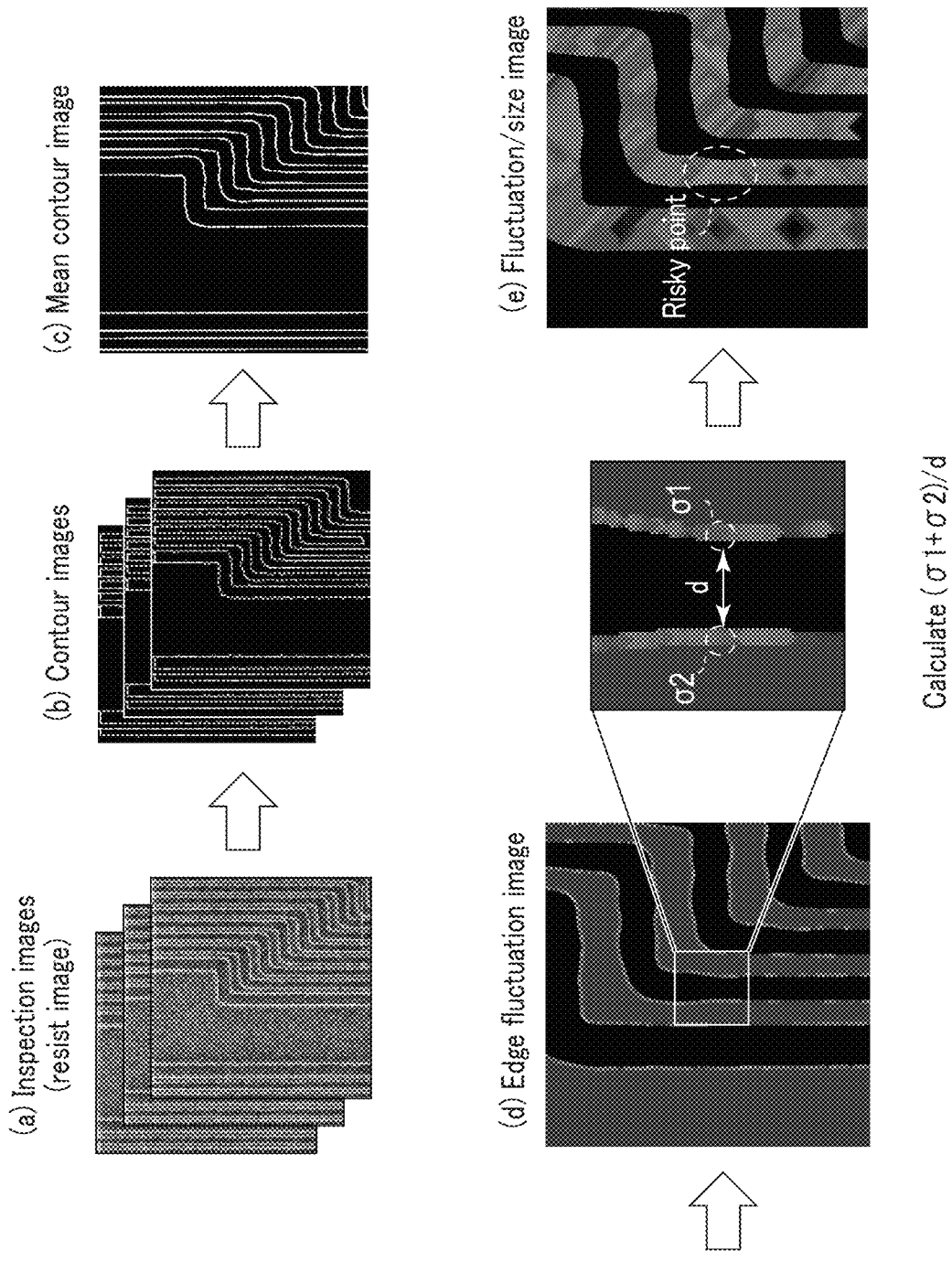
F I G. 5

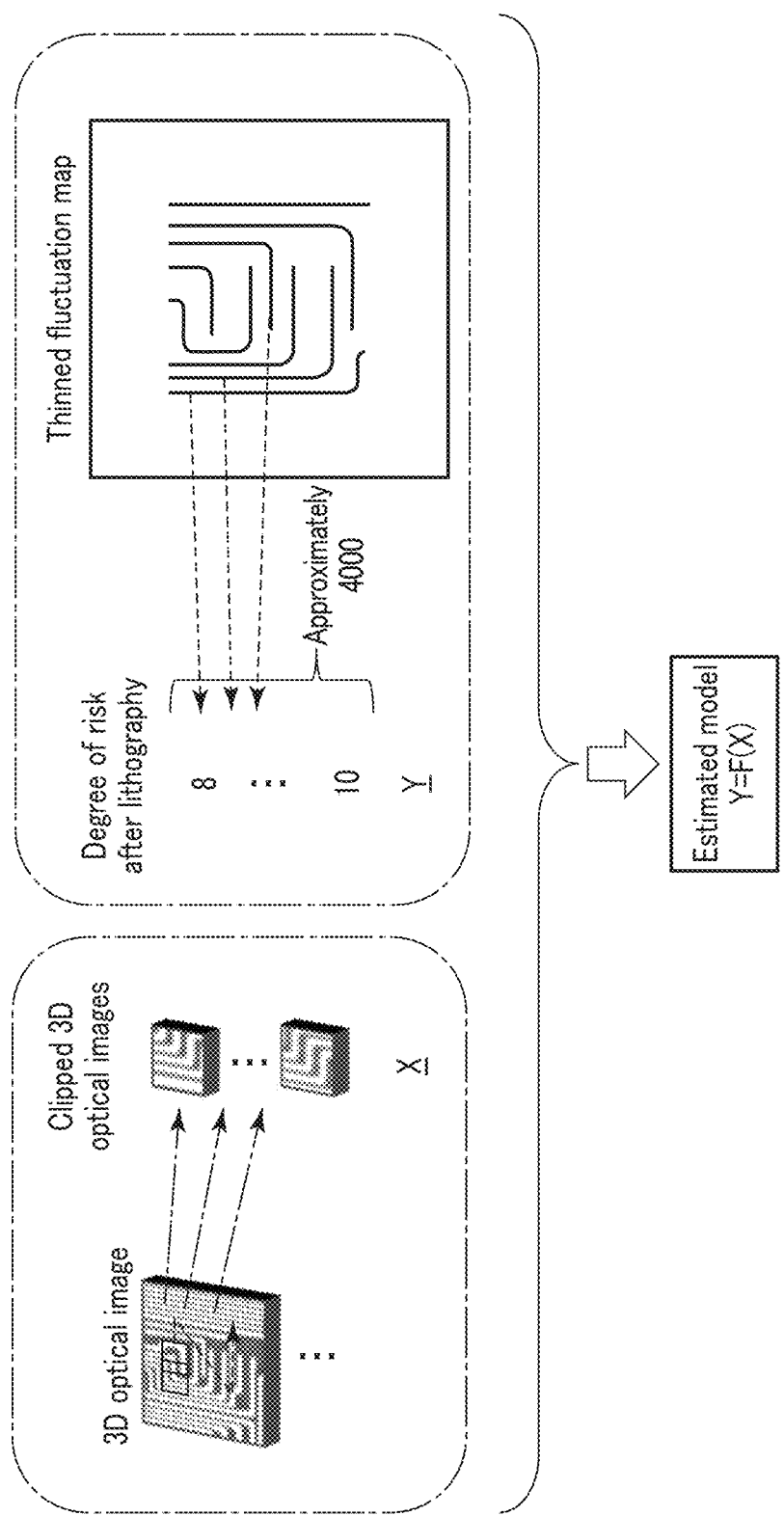
F I G. 10

METHOD FOR DISPLAYING INDEX VALUES IN GENERATION OF MASK PATTERN VERIFICATION MODEL

CROSS-REFERENCE TO RELATED APPLICATIONS

This application is based upon and claims the benefit of priority from prior Japanese Patent Application No. 2018-192027, filed Oct. 10, 2018, the entire contents of which are incorporated herein by reference.

FIELD

Embodiments described herein relate generally to a method for displaying index values in generation of a mask pattern verification model.

BACKGROUND

In designing of a mask for a semiconductor integrated circuit, a mask pattern is calculated by applying optical proximity correction (OPC) to circuit pattern data, and simulation evaluation of the mask pattern is performed using a model for mask pattern verification.

BRIEF DESCRIPTION OF THE DRAWINGS

FIG. 5 illustrates data processing in steps of the inspection image evaluation mode in the method for displaying index values in generation of a mask pattern verification model according to the first embodiment;

FIG. 10 illustrates an example of generation of a mask pattern verification model by machine learning in a method for displaying index values in generation of a mask pattern verification model according to a second embodiment;

DETAILED DESCRIPTION

In general, according to one embodiment, a method for displaying an index value in generation of a mask pattern verification model, includes: calculating a first index value using a plurality of images; estimating a model on the basis of the first index value and pattern information; calculating a second index value using the model; and displaying at least one of the first index value and the second index value.

1. First Embodiment

The following is description of a method for displaying index values in generation of a mask pattern verification model according to the first embodiment.

1.1 Overall Configuration of Mask Pattern Verification Device

First, description will be given of the overall configuration of a mask pattern verification device with reference to FIG. 1.

Figure 1:
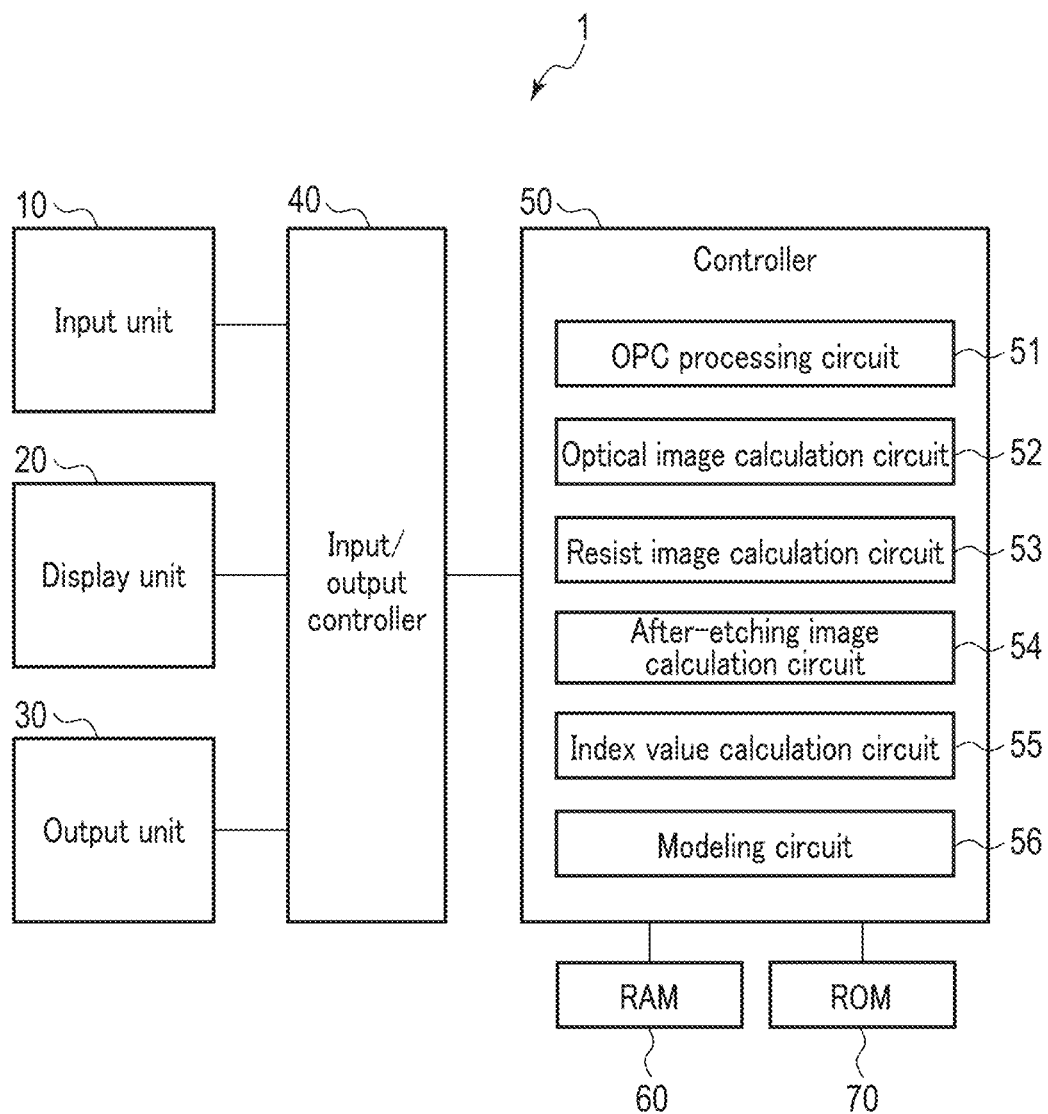
FIG. 1 is a block diagram of a mask pattern verification device used for a method for displaying index values in generation of a mask pattern verification model according to a first embodiment.

As illustrated in FIG. 1, a mask pattern verification device 1 includes an input unit 10, a display unit 20, an output unit 30, and input and output controller 40, a controller 50, a random access memory (RAM) 60, and a read only memory (ROM) 70.

The input unit 10 includes a keyboard and a mouse (not illustrated) or the like to input data or the like by the user. The input unit 10 also includes an input circuit (not illustrated). The input circuit executes interface processing when data is input from an external device, such as a circuit design device or an external database. For example, for a case where data is input from an external device through wireless communications, the mask pattern verification device 1 includes a communications unit including an antenna, and the input circuit is connected to the communications unit.

The display unit 20 is used for informing the user of a result of processing performed by the controller 50, and includes a display device, such as a liquid crystal monitor.

The output unit 30 includes an output circuit (not illustrated) to output a result of processing executed by the controller 50 to an external device. The output circuit executes interface processing when data is output to an external device. For example, for a case where data is output to an external device by wireless communications, the output circuit is connected to a communications unit. The output circuit 30 may also include, for example, a printer to output a result of processing executed by the controller 50.

The input and output controller 40 executes interface processing between the input unit 10, the display unit 20, and the output unit 30, and the controller 50.

The RAM 60 temporarily stores input data and data generated in mask pattern verification. The input data includes, for example, circuit pattern data, OPC conditions, exposure conditions (such as exposure value, exposure wavelength, and numerical aperture (NA)), process conditions (such as the base structure, resist conditions, and etching conditions), inspection image data (an inspection image of resist image or an image of after-etching image), size measurement data in the inspection image, and various types of data input by the user.

The ROM 70 is a storage medium storing a program to generate a mask pattern verification model, a program for executing verification of the mask pattern, and a mask pattern verification model (algorithm), and the like. The controller 50 executes arithmetic processing based on the program stored in the ROM 70, to generate a mask pattern verification model.

The controller 50 is configured by, for example, a central processing unit (CPU), and controls the entire mask pattern verification device 1. Each of the functions of the controller 50 may be realized with a dedicated circuit, or may be realized by the controller 50 executing firmware. The present embodiment illustrates a case where dedicated circuits are provided in the controller 50.

The controller 50 includes an OPC processing circuit 51, an optical image calculation circuit 52, a resist image calculation circuit 53, an after-etching image calculation circuit 54, an index value calculation circuit 55, and a model generation circuit 56.

The OPC processing circuit 51 executes OPC processing on circuit pattern data, and calculates a mask pattern.

The optical image calculation circuit 52 calculates an optical image on the basis of the mask pattern and exposure conditions, and the like.

The resist image calculation circuit 53 calculates a resist image based on the mask pattern, the optical image, and process conditions, and the like, using an acid diffusion model or the like.

The after-etching image calculation circuit 54 calculates, for example, an after-etching image based on the calculated resist image and the process conditions, and the like.

The index-value calculation circuit 55 calculates likelihood of occurrence of shape defect in the pattern to be verified, that is, risk (hereinafter referred to as "index values") of the pattern. The shape defect includes shape defect in the pattern after lithography and after etching. In the following description, a part (pattern) a calculated index value of which is equal to or larger than a preset value in the Mask layout, that is, a part in which shape defect easily occurs will be referred to as "risky point".

Calculation of the index values in the index-value calculation circuit 55 roughly includes two modes, that is, a mask verification mode and an inspection image evaluation mode.

The mask verification mode is a mode to calculate index values and risky points using a mask pattern verification model. The mask verification mode is used, for example, when circuit pattern data is verified in mask design.

The inspection image evaluation mode is a mode to calculate index values and risky points from inspection image data and size measurement data and the like after lithography or etching is actually performed. Information on the index values and the risky points calculated in the inspection image evaluation mode is used, for example, when a mask pattern verification model is generated in the model generation circuit 56.

The inspection images include, for example, electron beam images using a scanning electron microscope (SEN), optical images with an optical microscope, or X-ray images. The following describes a case where electron beam images are used as the inspection images.

The model generation circuit 56 generates (estimates) a mask pattern verification model and parameters used for the mask pattern verification model on the basis of, for example, information of the pattern (such as the optical image, resist image, and after-etching image) and information on the index values and the risky points. For example, a rule-based or a model-based mask pattern verification model is used as the mask pattern verification model. A rule-based model is a mask pattern verification model that is set by the user on the basis of, for example, the shape of a pattern or a distance between patterns, or the like. A model-based model is a mask pattern verification model obtained by, for example, optimizing the relational expression between information on patterns and the index values, that is, a mask pattern verification model based on a defined numerical expression. The model generation circuit 56 optimizes, for example, parameters used for the rule-based model, or the numerical expression and parameters used for the model-based model. The model generation circuit 56 may include, for example, a machine learning function, and design a model (numerical expression) used in the model-based model on the basis of information of the patterns and the index values, and the like.

1.2 Method for Generating Mask Pattern Verification Model

Description will be given of a method for preparing a mask pattern verification model with reference to FIG. 2 and FIG. 3.

Figure 2:
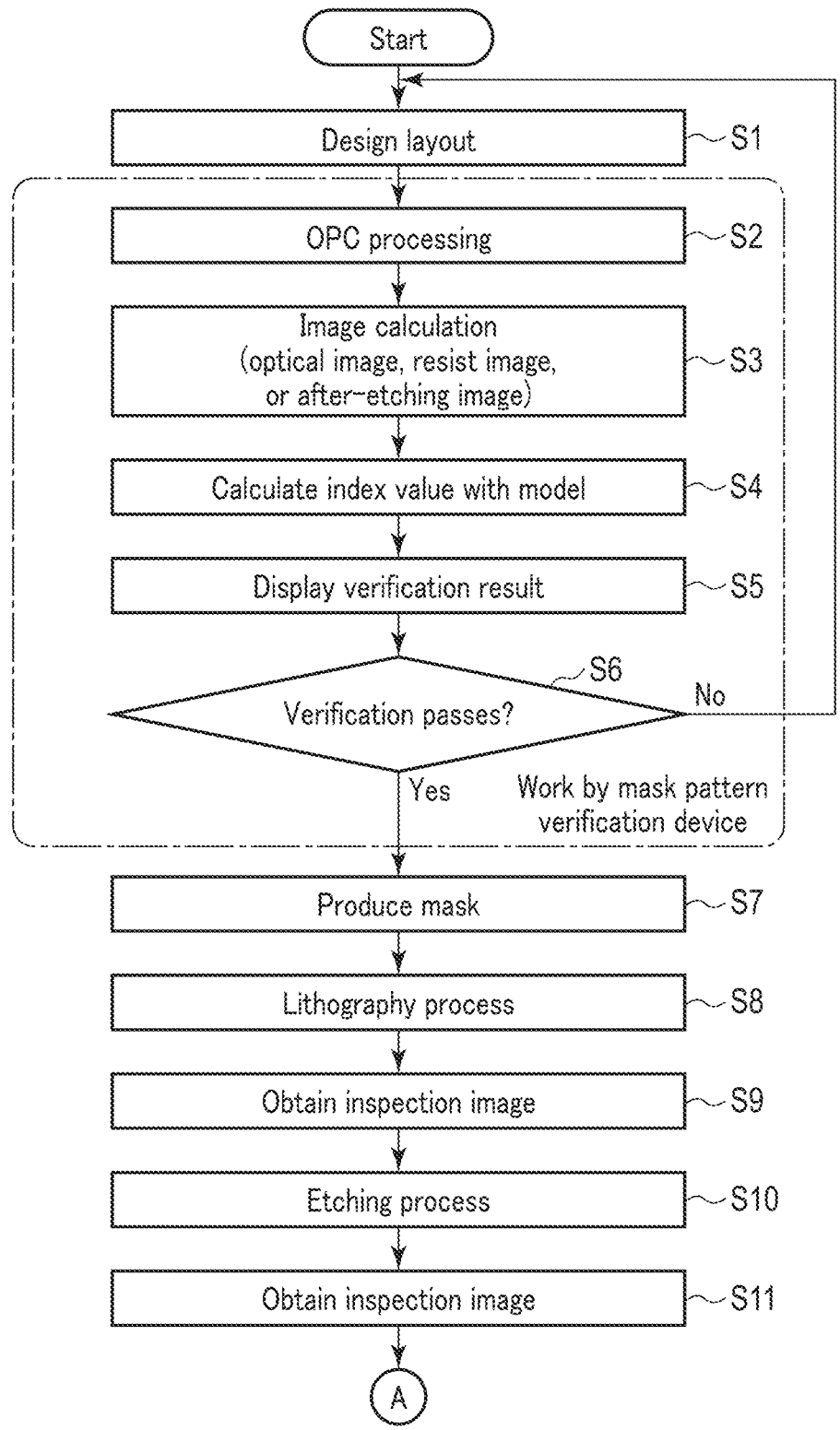
FIG. 2 is a flowchart of the method for displaying index values in generation of a mask pattern verification model according to the first embodiment.

As illustrated in FIG. 2, first, the user performs layout design (Step S1), and inputs circuit pattern data to the mask pattern verification device 1. More specifically, data on the mask pattern to be verified is input to the mask pattern verification device 1 through the input unit 10. For example, the input data includes circuit pattern data, OPC conditions, exposure conditions, and process conditions, and the like. The input data are stored in the RAM 60.

Next, in the mask pattern verification device 1, the OPC processing circuit 51 executes OPC processing on the basis of the circuit pattern data and the OPC conditions and the like, to calculate a mask pattern (Step S2). The data of the calculated mask pattern is stored in the RAM 60. In the following description, the processing at Steps S2 to S6 are executed in, for example, the mask pattern verification device 1.

Next, the controller 50 executes image calculation (Step S3). More specifically, first, the optical image calculation circuit 52 calculates an optical image on the basis of the mask pattern and the exposure conditions, and the like. The resist image calculation circuit 53 then calculates a resist image on the basis of the optical image, the exposure conditions, and the process conditions (base structure and resist conditions), and the like. Furthermore, the after-etching image calculation circuit 54 calculates an image of the after-etching image on the basis of the resist image and the process conditions (base structure, resist conditions, and etching conditions), and the like. Data of the calculated optical image, resist image, and after-etching image are stored in the RAM 60. The controller 50 may display these pieces of data on the display unit 20. For example, the user may determine an area for pattern verification with reference to the resist image or the after-etching image, or the like, displayed on the display unit 20. The calculation of the resist image or the after-etching image may be omitted, when it is not used for mask pattern verification.

Next, the index-value calculation circuit 55 calculates index values in the set pattern verification area in the mask verification mode using a mask pattern verification model (Step S4). More specifically, for example, at an early stage of development in a particular generation (design rule), the index-value calculation circuit 55 calculates index values using a mask pattern verification model in the previous generation that has been proven to work. As another example, when a mask pattern verification model of the generation corresponding to the circuit pattern has already been obtained, the index-value calculation circuit 55 calculates index values using the obtained mask pattern verification model. The calculated index values are stored in the RAM 60.

Next, the controller 50 displays, on the display unit 20, a result of the verification in the mask verification mode, that is, the index values and the risky points calculated using the mask pattern verification model (Step S5). The controller 50 determines whether the pattern verification area passes the mask pattern verification, on the basis of the verification result (Step S6). The user may perform the determination on the verification result.

When the pattern verification area fails to pass the mask pattern verification (No at Step S6), that is, when a risky point exists, the process returns to, for example, Step S1, and the layout is corrected. The OPC conditions may be adjusted without adjusting the layout. In this case, the process returns to Step S2, and OPC processing is performed again on the basis of the adjusted OPC conditions.

When the pattern verification area passes the verification (Yes at Step S6), that is, when no risky point exists, the user produces a mask on the basis of the mask pattern data (Step S7).

Next, lithography process is executed using the produced mask. For example, in the lithography process, a focus exposure matrix (FEM) wafer is produced to evaluate margins of the focus and the exposure time. An FEM wafer is a wafer having a plurality of chip patterns to be subjected to exposure with the focus margin and the exposure time shifted in a matrix manner. After the lithography, inspection image data (and size measurement data) of the resist images is obtained (Step S9). The inspection image data includes inspection images of the chip patterns to be evaluated, for example, variations of the lithography process, the focus margin, or the margin of the exposure time, or the like. The chip patterns for which respective inspection images are obtained may be located on the same wafer, chip patterns of a plurality of wafers in a set (hereinafter referred to as "lot") of a plurality of wafers in the manufacturing process, or chip patterns in different lots.

Thereafter, etching process is executed (Step S10). After etching, inspection image data (and size measurement data) of the after-etching image is obtained (Step S11). The inspection image data includes inspection images of a plurality of chip patterns to evaluate the variations of the process and the like. The chip patterns for which respective inspection images are obtained may be located on the same wafer, chip patterns of a plurality of wafers in a lot, or chip patterns in different lots.

Figure 3:
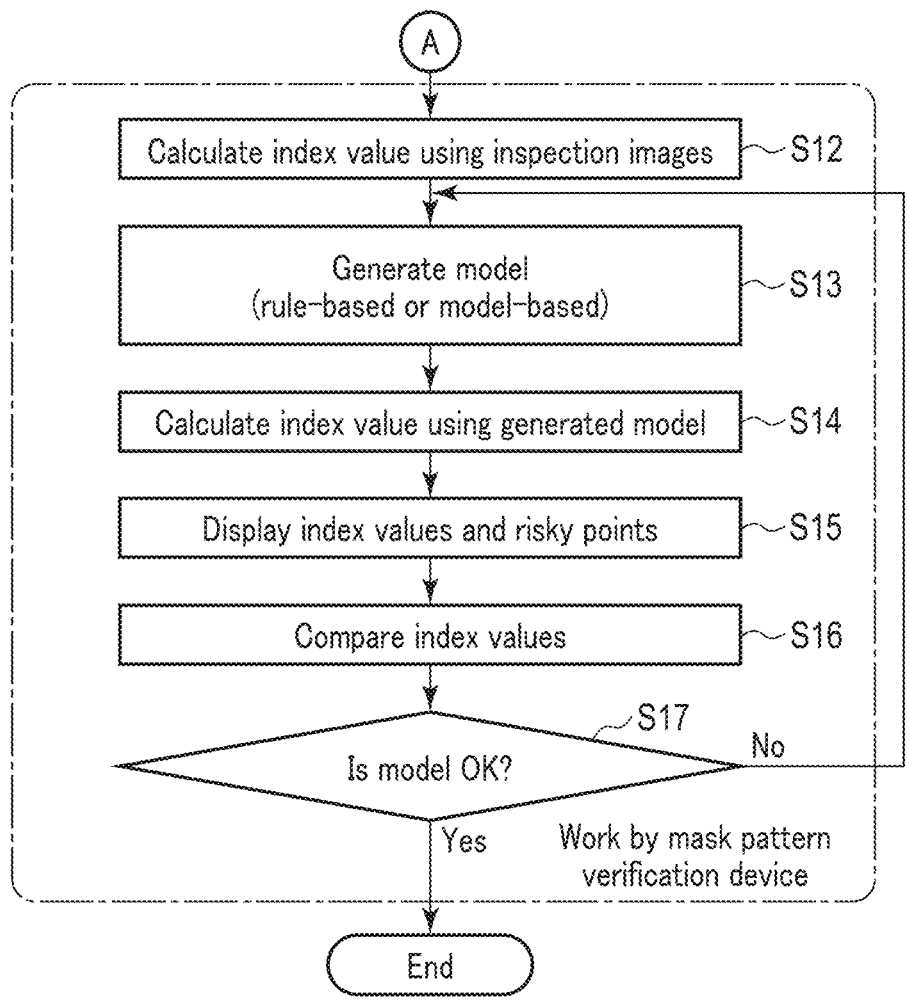
FIG. 3 is a flowchart of the method for displaying index values in generation of a mask pattern verification model according to the first embodiment.

As illustrated in FIG. 3, the inspection image data is input to the mask pattern verification device 1, and the index value calculation circuit 55 calculates index values in the inspection image evaluation mode using the inspection image data (Step S12). The calculated index values are stored in the RAM 60. In addition, the index value calculation circuit 55 calculates risky points on the basis of the index values obtained in the inspection image evaluation mode. The controller 50 may display at least one of the index values and the risky points calculated in the inspection image evaluation mode on the display unit 20. In the following description, the processing at Steps S12 to S17 are executed, for example, in the mask pattern verification device 1.

The model generation circuit 56 generates a (rule-based or model-based) mask pattern verification model or parameters of the mask pattern verification model, on the basis of the calculated index values (Step S13). The generated mask pattern verification model or the parameters are stored in the ROM 70.

Next, the index value calculation circuit 55 calculates index values in the mask verification mode using the mask pattern verification model or the parameters generated by the model generation circuit 56 (Step S14). The index value calculation circuit 55 detects a risky point on the basis of the index values obtained in the mask verification mode.

Next, the controller 50 displays a verification result, that is, the index values and the risky points obtained in the mask verification mode, on the display unit 20 (Step S15).

Next, the controller 50 compares the index values (and the risky points) obtained in the inspection image evaluation mode with the index values (and the risky points) obtained in the mask verification mode (Step S16), to determine whether the generated mask pattern verification model (or parameters) is applicable (Step S17). The user may examine the verification result displayed on the display unit 20 to determine the properness of the generated mask pattern verification model and parameters.

When the mask pattern verification model (or parameters) is not applicable (No at Step S17), for example, when a difference between the index values obtained in the inspection image evaluation mode and the index values obtained in the mask verification mode is equal to or larger than a preset value, the process returns to Step S13, and the mask pattern verification model or parameters is adjusted. The description has been made to a case of adjusting the mask pattern verification model or parameters; however the embodiment is not limited thereto. For example, the process may return to Step S9 or S11 to obtain inspection images of another pattern, or obtain inspection images of the same pattern again. As another example, the inspection images of a pattern generated using another mask may be obtained.

When the mask pattern verification model (or parameters) is applicable (Yes at Step S17), for example, when the difference between the index values obtained in the inspection image evaluation mode and the index values obtained in the mask verification mode is smaller than the preset value, the mask pattern verification device 1 ends generation of the mask pattern verification model.

The generated mask pattern verification model is used for verifying the mask pattern in mask design. In this case, the flow of mask pattern verification is similar to Steps S1 to S6.

There are cases where the difference between the simulation result and the inspection result obtained using the inspection images is comparatively large for the mask produced using the generated mask pattern verification model. More specifically, the mask pattern verification model needs to be modified in a case where, for example, the produced mask includes a pattern that is not included in the mask used for generating the mask pattern verification model, a case where a potential defect in the mask pattern verification model became real, or a case where the process conditions have been changed. In such cases, generation (adjustment) of the mask pattern verification model using the produced mask is repeated again in accordance with the flow illustrated in FIG. 2 and FIG. 3. This can improve the accuracy of the mask pattern verification model.

1.3 Calculation of Index Values Using Inspection Images

Description will be given of details of index values calculation using inspection images.

1.3.1 Calculation of Index Values Using Inspection. Images of Resist Image

Figure 4:
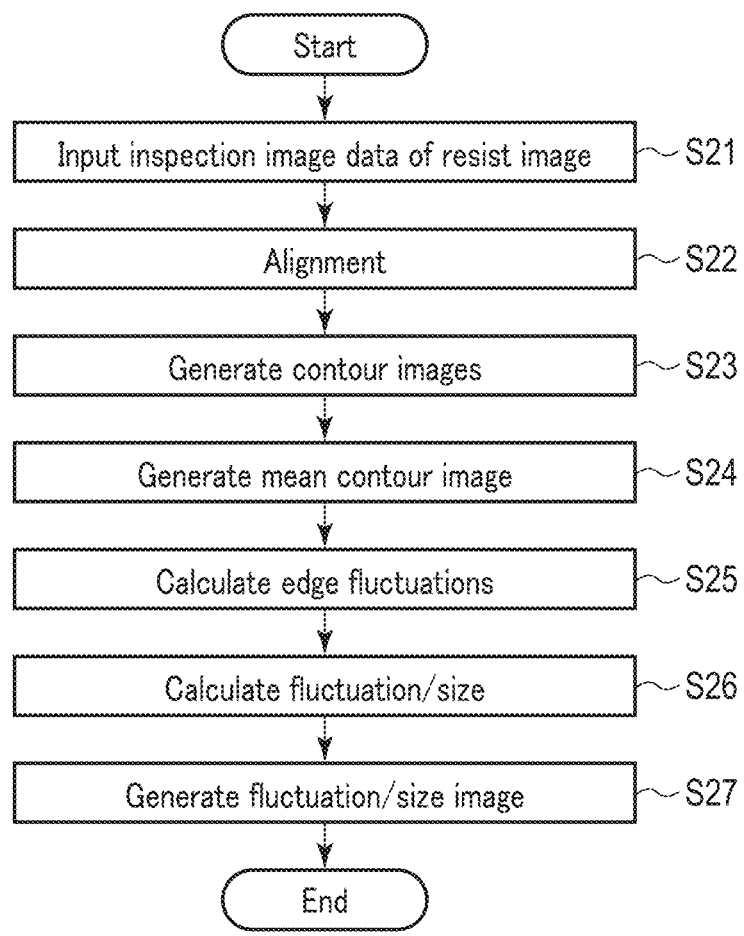
FIG. 4 is a flowchart of calculation of index values in an inspection image evaluation mode using inspection images of resist image in the method for displaying index values in generation of a mask pattern verification model according to the first embodiment.
Figure 6:
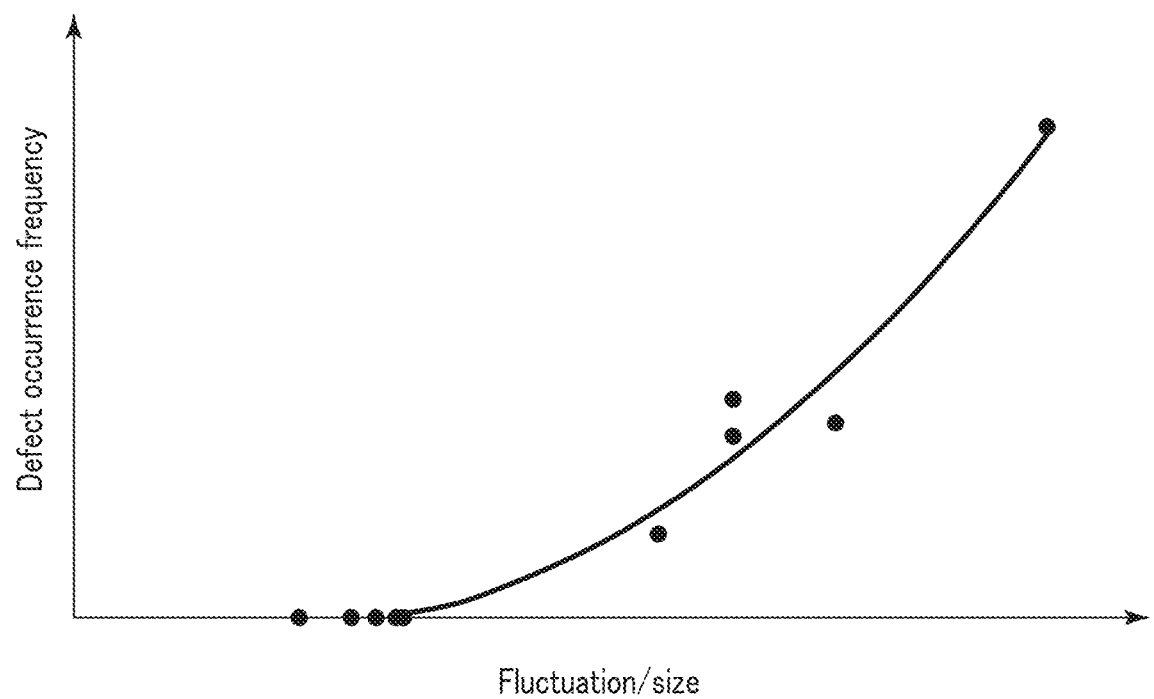
FIG. 6 is a graph illustrating relation between defect occurrence frequency and fluctuation/size in the method for displaying index values in generation of a mask pattern verification model according to the first embodiment.

First, description will be given of an example of calculation of index values using inspection images of resist image with reference to FIG. 4 to FIG. 6. FIG. 4 is a flowchart of calculation of index values in the inspection image evaluation mode using inspection images of resist image. FIG. 5 illustrates data processing in steps in the inspection image evaluation mode. FIG. 6 is a graph illustrating relation between the defect occurrence frequency and fluctuation/size. Description will be given of an exemplary case of calculation of index values on the basis of relation between the variations (hereinafter also referred to as "fluctuations") in size measurement data in a plurality of inspection images and the pattern size. In the following description, the term "line region" indicates the region in which the resist remains in an inspection image of the resist and the region that is not processed in the inspection image after etching, and the term "space region" indicates the region from which the resist is removed in the inspection image of resist and the region processed in the inspection image after etching.

As illustrated in FIG. 4 and FIG. 5, first, inspection image data and size measurement data of resist image are input to the mask pattern verification device 1 (Step S21). The inspection image data includes a plurality of inspection images ((a) of FIG. 5) obtained in the same imaging area of a plurality of chip patterns. The input inspection image data and size measurement data are stored in, for example, the RAM 60.

The index-value calculation circuit 55 performs alignment (matching of coordinates) of the inspection images (Step S22), and thereafter generates respective contour images ((b) of FIG. 5) of the inspection images (Step S23). A contour image is an image obtained by extracting the contours (the boundaries between the line regions and the space regions) of resist image.

Next, the index value calculation circuit 55 generates a mean contour image ((c) of FIG. 5) by averaging the contour images (Step S24).

Next, the index value calculation circuit 55 calculates edge fluctuations from the contour images and the mean contour image (Step S25), to generate an edge fluctuation image ((d) of FIG. 5). More specifically, an edge fluctuation is a fluctuation of a contour image with respect to the mean contour image, that is, a difference in distance of contours between the mean contour image and the contour image. Assume that the edge fluctuation width is $\sigma$, an edge fluctuation image is an image showing the edge fluctuation width a. For example, when the edge fluctuation width $\sigma$ is the same for resist patterns having different sizes, that is, having different space-region widths, shape defect more easily occurs when the size (the space region width) is narrower.

When the edge fluctuation widths on the both sides of a particular space region are $\sigma 1$ and $\sigma 2$ and the size (the width of the space region) is d, the index value calculation circuit 55 calculates "$(\sigma 1 - \sigma 2)/d$" as the fluctuation/size used as an index value (Step S26), and generates a fluctuation/size image ((e) of FIG. 5) (Step S27). For example, the controller 50 may display the image of (e) of FIG. 5 on the display unit 20 to enable the user to see the index value evaluation result.

As illustrated in FIG. 6, defect occurrence frequency tends to be high when an index value is high, that is, fluctuation/size is high. Accordingly, the controller 50 may detect a place in which the value of fluctuation/size (($\sigma 1 + \sigma 2)/d$) is equal to or larger than the preset value, as a risky point, and display the risky point on, for example, the image (e) of FIG. 5.

An index value is not limited to the value of fluctuation/size. For example, an index value to be calculated may be the number of defects the defect ratio (number of defects/number of inspection images), or fluctuations, that is, the size fluctuation quantity.

Figure 7:
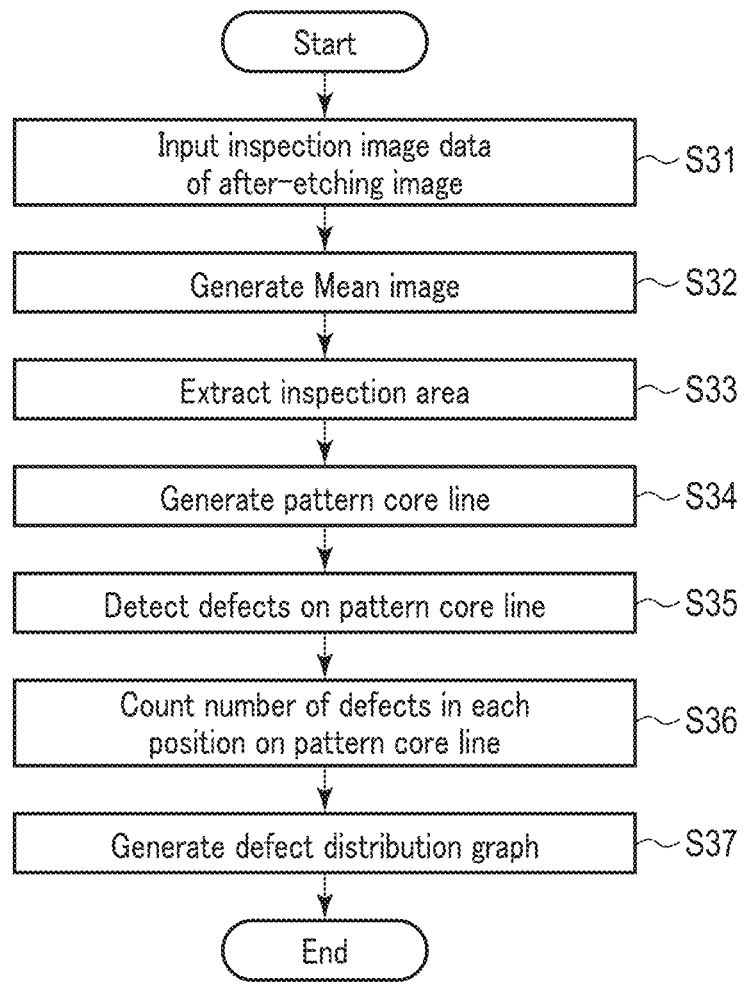
FIG. 7 is a flowchart of calculation of index values in the inspection image evaluation mode using inspection images of after-etching image in the method for displaying index values in generation of a mask pattern verification model according to the first embodiment.
Figure 8:
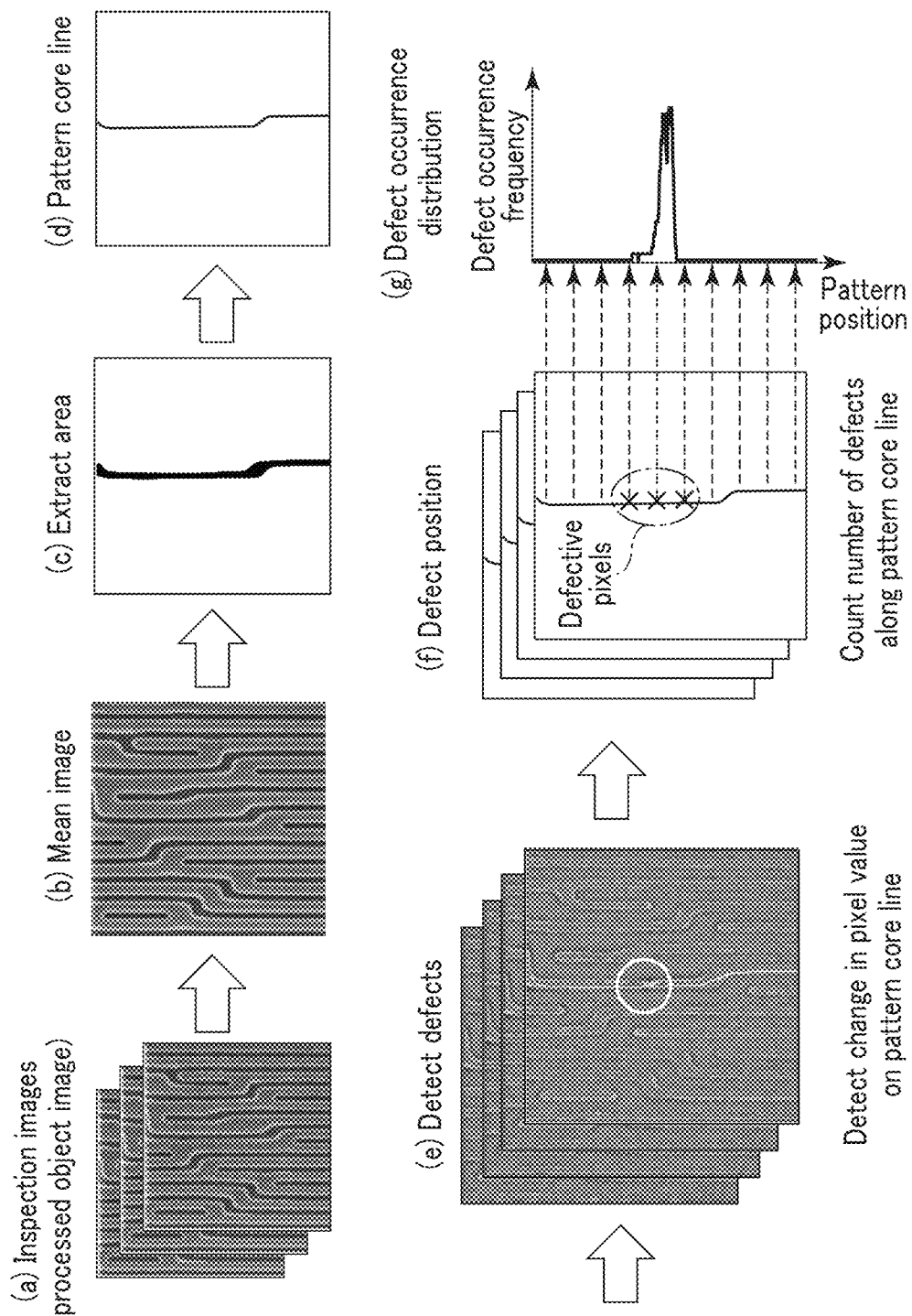
FIG. 8 illustrates data processing in steps of the inspection image evaluation mode in the method for displaying index values in generation of a mask pattern verification model according to the first embodiment.

1.3.2 Calculation of Index Values Using Inspection Images of after-Etching Image Description will be given of an example of calculation of index values using inspection images of after-etching image with reference to FIG. 7 and FIG. 8. FIG. 7 is a flowchart of calculation of index values in the inspection image evaluation mode using inspection images of after-etching image. FIG. 8 illustrates data processing in steps in the inspection image evaluation mode. Description will be given of an exemplary case of calculation of frequency of occurrence of shape defects in the after-etching image, as index values.

As illustrated in FIG. 7 and FIG. 8, inspection image data of after-etching image is input to the mask pattern verification device 1 (Step S31). The inspection image data includes a plurality of inspection images ((a) of FIG. 8) obtained in the same imaging area of a plurality of chip patterns. The input inspection image data is stored in, for example, the RAM 60.

First, the index value calculation circuit 55 generates a mean image ((b) of FIG. 8) by averaging the inspection images (Step S32). Instead of generating a mean image, for example, one or more images (representative images) may be selected from the inspection images by the controller 50 on the basis of preset conditions, or by the user manually.

Thereafter, the index value calculation circuit 55 extracts an inspection area ((c) of FIG. 8) from the mean image (Step S33). For example, the controller 50 may display the mean image on the display unit 20, and the user may determine the inspection area. For example, a space region is set as the inspection area.

Next, the index value calculation circuit 55 generates a pattern core line ((d) of FIG. 8) that indicates the center line in the inspection area (Step S34).

Next, the index value calculation circuit 55 examines pixel values in respective positions on the pattern core line, and detects a position ((e) in FIG. 8) having the pixel value varying (different) from other positions or the other inspection images as a defective pixel (defective point) (Step S35).

Next, the index value calculation circuit 55 counts such defective pixels ((f) of FIG. 8) detected in each of the inspection images for each of pattern positions (coordinates) of the pattern core line, for example, in units of pixels of the inspection image (Step S36).

Next, the index value calculation circuit 55 calculates defect occurrence frequency, with the number of defective pixels (number of defects) counted along the pattern core line as the index values, and generates a defect distribution graph ((g) of FIG. 8) (Step S37).

For example, the controller 50 may display the generated defect distribution graph on the display unit 20 to enable the user to see the index value calculation result. As another example, the controller 50 may detect a pattern position having defect occurrence frequency equal to or larger than the preset value, as a risky point.

1.4 Example of Comparison Between Index Values Obtained in Inspection Image Evaluation Mode and Index Values Obtained in Mask Verification Mode Description will be given of comparison between the index values obtained in the inspection image evaluation mode and the index values obtained in the mask verification mode with reference to FIG. 9. The example of FIG. 9 illustrates a case of comparing index values calculated using inspection image data with index values calculated using a rule-based mask pattern verification model.

Figure 9:
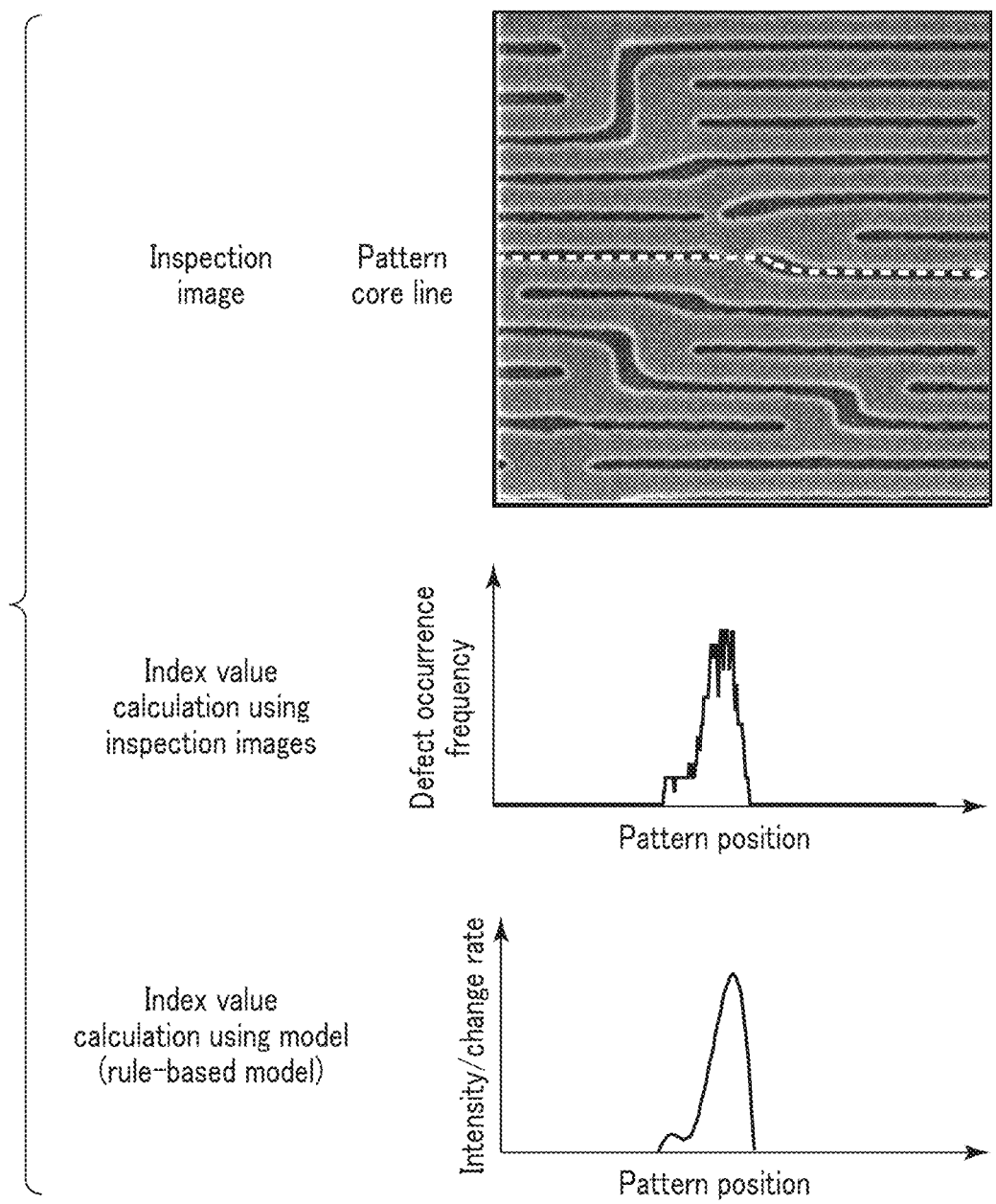
FIG. 9 illustrates comparing index values calculated using inspection images with index values calculated through a rule-based mask pattern verification model in the method for displaying index values in generation of a mask pattern verification model according to the first embodiment.

As illustrated in the upper section and the middle section of FIG. 9, for example, the index value calculation circuit 55 generates a pattern core line from inspection image data of after-etching image, and calculates defect occurrence frequencies for respective pattern positions on the pattern core line, as the index values based on the inspection image evaluation mode.

For example, the model generation circuit 56 sets a rule-based mask pattern verification model such that the index values obtained in the mask verification mode approximates to the defect distribution graph.

As illustrated in the lower section of FIG. 9, for example, the index value calculation circuit 55 calculates ratios, each of which is a ratio of a change rate of an optical image intensity to change in intensity/exposure conditions of the optical image, as index values based on the mask pattern verification model in the same verification area. The index values obtained in the mask pattern verification model is not limited to the ratios of the change rate of the optical image intensity to change in intensity/exposure conditions of the optical image. For example, the index values may be optical image intensity, or the change rate of the optical image intensity with respect to change of the exposure conditions.

For example, the controller 50 compares the graph illustrating the detect occurrence frequency illustrated in the middle section of FIG. 9 with the graph illustrating the change rate (intensity/change rate illustrated in FIG. 9) of the optical image intensity to the change of intensity/exposure conditions illustrated in the lower section of FIG. 9, to determine properness of the generated rule-based mask pattern verification model. The user may determine properness of the mask pattern verification model, with reference to the graph of defect occurrence frequency and the graph of the change rate of the optical image intensity to change of intensity/exposure conditions of the optical image, which are displayed on the display unit 20.

1.5 Advantageous Effects of the Present Embodiment

The configuration according to the present embodiment can improve accuracy of verification of mask a pattern. This advantageous effect will be described in detail.

Examples of the method for verifying a mask pattern include a method of forming a FEM wafer and determining presence or absence of a defect in shape of the pattern through user's visual observation. Because shape defects stochastically occur due to influence of process variations, presence or absence of defects and situation in which defects occur differ even if a repetitive pattern of the same conditions is evaluated a plurality of times. In addition, the standard for detection may vary according to users. For these reasons, the evaluation results may be difficult to be used for verification of the mask pattern through simulation.

By contrast, the configuration according to the present embodiment enables calculation of the index values using inspection image data including a plurality of inspection images, and estimation of the mask pattern verification model and parameters of the mask pattern verification model on the basis of the index values calculated using the inspection image data and the pattern information. In addition, the configuration enables calculation of the index values using a mask pattern verification model, and display of the index values calculated using the mask pattern verification model. This can reduce variations of evaluation of inspection image data, and further improve consistency of the evaluation result obtained using inspection image data and the simulation result obtained using the mask pattern verification model. This in turn can generate a mask pattern verification model that can improve accuracy of verification of a mask pattern through simulation.

In addition, the configuration according to the present embodiment enables display of the index values (risky points) calculated using inspection image data and the index values (risky points) calculated using the mask pattern verification model, on the display unit 20. This enables the user to easily find a difference between the index values (risky points) calculated using inspection image data and the index values (risky points) calculated using the mask pattern verification model, to determine properness of the generated mask pattern verification model.

Besides, the configuration according to the present embodiment enables calculation of the index values using inspection image data after etching. The configuration also enables use of the index values calculated using inspection image data after etching for generating a mask pattern verification model and parameters of the mask pattern verification model. Accordingly, a mask pattern verification model also in consideration of the processed shape after etching can be generated.

2. Second Embodiment

The second embodiment will be described. In the second embodiment, description will be given of an example of generating a model-based mask pattern verification model by machine learning.

2.1 Example of Generation of Mask Pattern Verification Model by Machine Learning Description will be given of an example of generation of a mask pattern verification model by machine learning with reference to FIG. 10.

As illustrated in FIG. 10, the index value calculation circuit 55 clips each of inspection images (three-dimensional (3D) optical images in the example of FIG. 10) after lithography, to divide the image into a plurality of 3D optical images. A variable X is a pattern position of the inspection area in each of the clipped 3D optical images.

The index value calculation circuit 55 also generates an edge fluctuation image from the contour images of the inspection images and the mean contour image, and generates a thinned fluctuation map showing the fluctuation quantity represented by a pixel value from the edge fluctuation image. A variable Y is the degree of risk after lithography corresponding to the variable X in the thinned fluctuation map, that is, the index values. For example, in the example of FIG. 10, the number of values for the variable Y (index value) respectively corresponding to values for the variable X (pattern position) is approximately 4000.

The model generation circuit 56 calculates an estimated model "Y=F(X)" of the mask pattern verification model from the relation between the variable X and the variable Y through machine learning.

2.2 Advantageous Effects of the Present Embodiment

The configuration according to the present embodiment is applicable to the first embodiment.

3. Third Embodiment

The third embodiment will be described. In the third embodiment, description will be given of three examples for display on the display screen in the display unit 20. The mask pattern verification device 1 includes, for example, a graphical user interface (GUI). The user sets display conditions by operating the mouse or the keyboard.

3.1 First Example

First, description will be given of the first example with reference to FIG. 11. The first example relates to an example of displaying a two-dimensional image of the calculated index values. The index values in the present example may be index values calculated in the inspection image evaluation mode, or index values calculated in the mask verification mode. The following description illustrates index values calculated in the mask verification mode, as an example.

Figure 11:
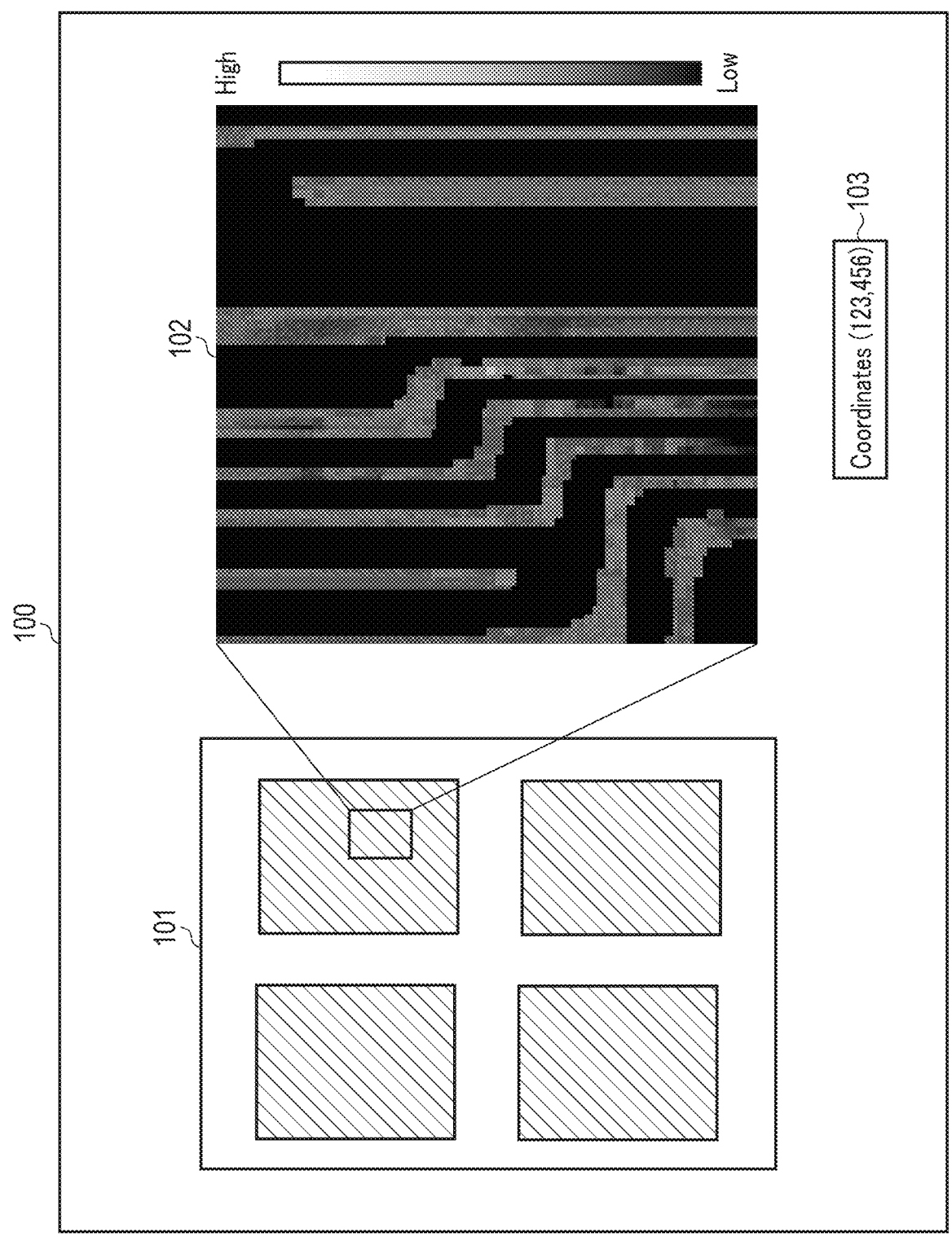
FIG. 11 illustrates exemplary display of a two-dimensional image of index values calculated in a method for displaying index values in generation of a mask pattern verification model according to a first example of a third embodiment.

As illustrated in FIG. 11, the display screen 100 displays, for example, a mask layout whole image display window 101, an index value image display window 102, and a coordinate display window 103.

The mask layout whole image display window 101 displays, for example, the whole image of the circuit patterns. The mask layout whole image display window 101 also displays an inspection area corresponding to the index value image display window 102, for example, with a square frame. For example, the user sets the inspection area on the mask layout whole image display window 101. The mask layout whole image display window 101 is not limited to displaying circuit patterns, but may display mask pattern, optical image, resist image, or after-etching image.

The index value image display window 102 displays the index values in the inspection area selected in the mask layout whole image display window 101, as two-dimensional image data. In the example of FIG. 11, the index values calculated in the mask verification mode are displayed in gradation between white and black, that is, a pixel value. The area with a higher index value is displayed in white, that is, with a high pixel value. For example, the index value image display window 102 may display an area with a certain pixel value or larger as a risky point.

The coordinate display window 103 displays coordinates of the inspection area selected in the mask layout whole image display window 101, or coordinates of the area selected on the index values image display window 102.

3.2 Second Example

Description will be given of the second example with reference to FIG. 12. The second example relates to an example of displaying risky points. The index values in the present example may be index values calculated in the inspection image evaluation mode, or index values calculated in the mask verification mode.

Figure 12:
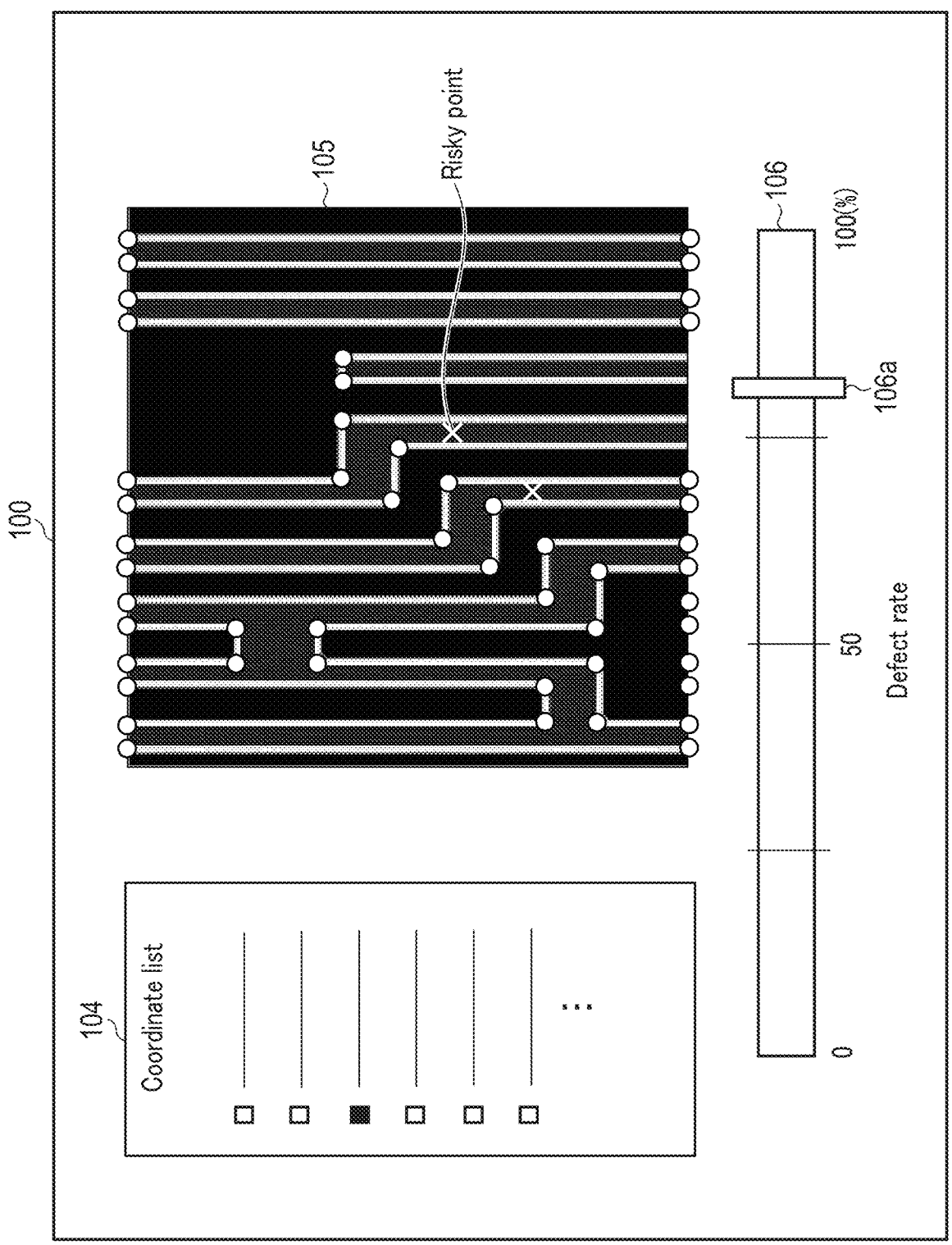
FIG. 12 illustrates exemplary display of risky points in a method for displaying index values in generation of a mask pattern verification model according to a second example of the third embodiment.

As illustrated in FIG. 12, the display screen 100 displays, for example, a coordinate list display window 104, a polygon image display window 105, and a risky point detection value display window 106.

The coordinate list display window 104 displays a list of coordinates of inspection areas on the mask layout. For example, the user selects an inspection area from the coordinate list. More specifically, the window is provided with check boxes corresponding to the respective coordinates, and the user clicks a checkbox for coordinates to be selected by operating the mouse or the like. This highlights the selected checkbox, for example, from white to black.

The polygon image display window 105 displays a circuit pattern corresponding to the coordinates selected form of image of polygons (hereinafter referred to as "polygon image"). In addition, for example, risky points (symbol "X") are displayed on the polygon image. The polygon image is not limited to a circuit pattern, but may be a polygon image of a mask pattern, optical image, resist image, or after-etching image.

The risky point detection value display window 106 is a window to set a detection value to detect an index value as a risky point. The example of FIG. 12 illustrates a case where the defect rates are calculated as the index values, and the value "80%" is set as the detection value. In this case, a part with a defect rate of 80% or larger is displayed as a risky point in the polygon image display window 105. For example, the user changes the detection value by sliding a detection value setting slide bar 106a by operating the mouse or the like. An index value is not limited to the defect rate. For example, the index value may be defect occurrence frequency, or the value of fluctuation/size.

3.3 Third Example

Description will be given of the third example with reference to FIG. 13. The third example relates to an example of comparing the index values calculated using inspection image data with the index values estimated using the mask pattern verification model.

Figure 13:
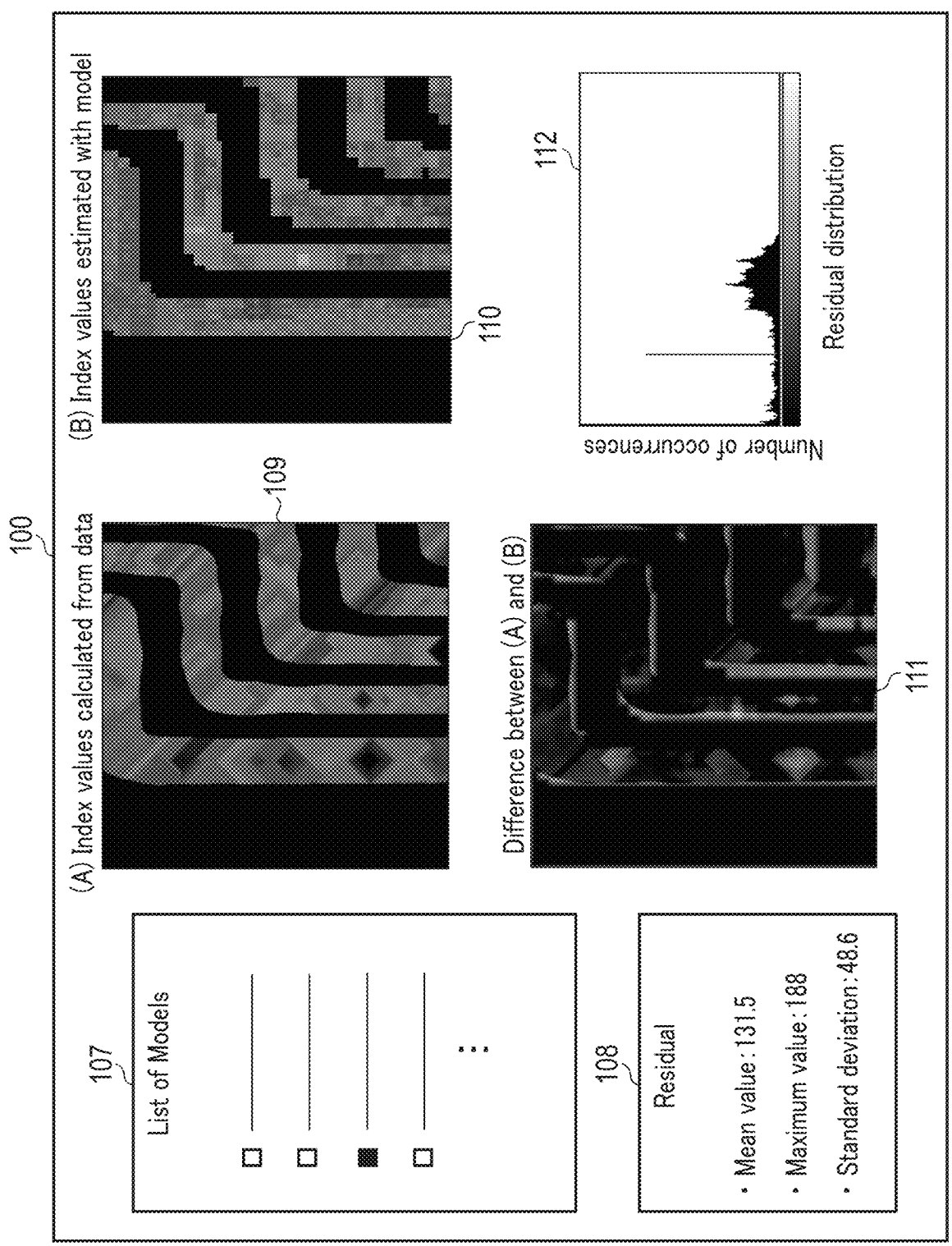
FIG. 13 illustrates exemplary display comparing index values obtained in an inspection image evaluation mode with index values obtained in a mask verification mode in a method for displaying index values in generation of a mask pattern verification model according to a third example of the third embodiment.

As illustrated in FIG. 13, the display screen 100 displays a model list display window 107, a residual selection display window 108, image display windows 109 to 111, and a residual distribution display window 112.

The model list display window 107 displays a list of a plurality of mask pattern verification models including rule-based models and model-based models. For example, the user selects a mask pattern verification model from the model list. More specifically, for example, the window 107 is provided with checkboxes corresponding to the respective mask pattern verification models, and the user clicks a checkbox of the mask pattern verification model to be selected by operating the mouse or the like. This highlights the selected checkbox, for example, from white to black.

The image display window 109 displays, for example, the index values calculated using the inspection image data. In the example of FIG. 13, the image display window 109 displays the fluctuation/size image calculated from the inspection image data and the size measurement data after lithography.

The image display window 110 displays, for example, the index values estimated (calculated) using the mask pattern verification model selected in the model list display window 107. In the example of FIG. 13, the image display window 110 displays image data of index values, as in FIG. 11.

The image display window 111 displays, for example, a difference (residual) between the image display window 109 and the image display window 110. In the example of FIG. 13, an area (pixel) with a larger difference between the image display window 109 and the image display window 110 is displayed with a higher pixel value (white).

The residual distribution display window 112 displays a graph illustrating relation between the residual, that is, the pixel value, and the number of occurrences (number of pixels), on the basis of the results of the image display window 111. For example, the user may determine properness of the mask pattern verification model on the basis of the graph of residual distribution.

The residual selection display window 108 displays a statistical summary for the residuals, which is displayed in the residual distribution display window 112. Such a summary includes, for example, the mean value, the maximum value, and the standard deviation value of residuals. FIG. 13 illustrates an example in which the mean value, the maximum value, and the standard deviation value of residuals are respectively 131.5, 188, and 48.6.

3.4 Advantageous Effects of the Present Embodiment

The configuration according to the present embodiment is applicable to the first embodiment.

The display windows 101 to 112 in the first to the third examples may be used in combination as long as combination is possible.

4. Modifications

A method for displaying an index value in generation of a mask pattern verification model according to above-described embodiments includes: calculating a first index value using a plurality of images (step S12); estimating a model on the basis of the first index value and pattern information (step S13); calculating a second index value using the model (step S14); and displaying at least one of the first index value and the second index value (step S15).

Applying the embodiments described above can provide a method for displaying index values in generation of a mask pattern verification model that can improve accuracy of mask pattern verification.

The embodiments are not limited to the forms described above, but various modifications are possible.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method for displaying an index value in generation of a mask pattern verification model, the method comprising:
    calculating a first index value using a plurality of images, the images including an image of a resist image after lithography or an image of an after-etching image in manufacturing of a semiconductor device;
    estimating a model based on the first index value and pattern information;
    calculating a second index value using the model; and
    displaying at least one of the first index value and the second index value.

2. The method according to claim 1, further comprising:
    detecting a first risky point based on the first index value or a second risky point based on the second index value; and
    displaying at least a detected one of the first risky point and the second risky point.

3. The method according to claim 1, wherein:
    the calculating of the first index value includes:
        generating a plurality of contour images from the images, respectively;
        generating a mean contour image from the contour images; and
        calculating a difference in a distance of contours between each of the contour images and the mean contour image.

4. The method according to claim 1, wherein:
    the calculating of the first index value includes:
        obtaining a representative image, the representative image being one of the images or a mean image of the images;
        extracting an inspection area from the representative image; and
        counting a number of defects in the images for each position in the inspection area.

5. The method according to claim 1, wherein:
    the images are electron beam images, optical images, or X-ray images.

6. The method according to claim 1, wherein:
    the first index value is one of a number of defects of a pattern shape, a defect rate, and a fluctuation quantity of a pattern size.

7. The method according to claim 1, wherein:
    the pattern information includes information of an optical image, a resist image, or an after-etching image.

8. The method according to claim 1, wherein:
    the model is at least one of a rule-based model and a model-based model.

9. The method according to claim 1, wherein:
    the displaying includes simultaneously displaying both a display window of the second index value and a coordinate window of the second index value.

10. The method according to claim 1, wherein:
    in the displaying, at least one of a two-dimensional image of the first index value and a two-dimensional image of the second index value is displayed.

11. The method according to claim 1, wherein:
    the second index value is a defect rate or defect occurrence frequency in a pattern position.

12. The method according to claim 1, wherein:
    the second index value is an intensity of an optical image, a rate of change of the intensity to a change in exposure conditions, or a ratio of the intensity and the rate of change of the intensity to the change in exposure conditions.

13. The method according to claim 1, wherein:
the estimating of the model is based on a relation between a pattern position and the first index value in the pattern position.
14. The method according to claim 1, wherein:
the displaying includes simultaneously displaying a display window of the second index value and a mask layout whole image display window.
15. The method according to claim 1, wherein:
the displaying includes simultaneously displaying a display window of the first index value or the second index value and a risky point detection value display window.
16. The method according to claim 1, wherein:
the displaying includes simultaneously displaying a display window of the first index value and a display window of the second index value.
17. The method according to claim 1, further comprising:
calculating a difference between the first index value and the second index value; and
displaying the difference.
18. The method according to claim 1, wherein:
the calculating of the first index value includes:
  selecting one of the images or a mean image of the images as a representative image; and
  extracting an inspection area from the representative image.
19. The method according to claim 8, wherein:
the model-based model is generated by machine learning.

* * * * *